(12) United States Patent
Yun et al.

(10) Patent No.: US 12,721,224 B2
(45) Date of Patent: Aug. 25, 2026

(54) SEMICONDUCTOR PACKAGE AND SYSTEM INCLUDING SEMICONDUCTOR PACKAGE

(71) Applicant: Samsung Electronics Co., Ltd., Suwon-si (KR)

(72) Inventors: Hyojin Yun, Suwon-si (KR); Unbyoung Kang, Suwon-si (KR); Seokbong Park, Suwon-si (KR); Sechul Park, Suwon-si (KR); Junyoung Park, Suwon-si (KR); Teahwa Jeong, Suwon-si (KR); Juil Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 606 days.

(21) Appl. No.: 18/314,287

(22) Filed: May 9, 2023

(65) Prior Publication Data

US 2024/0088094 A1 Mar. 14, 2024

(30) Foreign Application Priority Data

Sep. 8, 2022 (KR) ........................ 10-2022-0113986

(51) Int. Cl.
*H01L 25/065* (2023.01)
*H01L 23/31* (2006.01)
(Continued)

(52) U.S. Cl.
CPC .......... *H10W 90/00* (2026.01); *H10W 70/611* (2026.01); *H10W 70/685* (2026.01);
(Continued)

(58) Field of Classification Search
CPC .. H10W 90/00; H10W 70/685; H05K 1/0277; H05K 1/028; H05K 1/0283;
(Continued)

(56) References Cited

U.S. PATENT DOCUMENTS 10,290,589 B2 5/2019 Haba et al.
10,770,383 B2 9/2020 Im
(Continued)

FOREIGN PATENT DOCUMENTS

CN 1929129 A * 3/2007
CN 100459123 C 2/2009
(Continued)

*Primary Examiner* — Lawrence C Tynes, Jr.
(74) *Attorney, Agent, or Firm* — Wolf, Greenfield & Sacks, P.C.

(57) ABSTRACT

A semiconductor package includes a substrate including a first region, a second region in contact with the first region with the first and second regions stacked in a first direction, and a third region extending from the first and second regions in a second direction, perpendicular to the first direction, to connect the first and second regions to each other in bent form, a first semiconductor chip on a first side opposite to a second side of the first region in contact with the second region, a second semiconductor chip on a first side opposite to a second side of the second region in contact with the first region, a first molding member on the first region and covering at least a portion of the first semiconductor chip, and a second molding member on the second region and covering at least a portion of the second semiconductor chip.

20 Claims, 15 Drawing Sheets

(51) Int. Cl.
*H01L 23/538* (2006.01)
*H10W 70/60* (2026.01)
*H10W 70/67* (2026.01)
*H10W 70/685* (2026.01)
*H10W 74/10* (2026.01)
*H10W 90/00* (2026.01)

(52) U.S. Cl.
CPC ....... *H10W 70/688* (2026.01); *H10W 74/131* (2026.01); *H10W 90/701* (2026.01); *H10W 90/724* (2026.01)

(58) Field of Classification Search
CPC .. H05K 1/147; H05K 1/189; H05K 2201/055; H05K 2201/058; H05K 2201/051; H05K 2201/042; H05K 2201/046; H01L 25/0655; H01L 25/0652; H01L 25/0657
See application file for complete search history.

(56) References Cited

U.S. PATENT DOCUMENTS

| | | | | |
|---|---|---|---|---|
| 11,296,063 | B2 | 4/2022 | Yoo et al. | |
| 2005/0006743 | A1 | 1/2005 | Kim et al. | |
| 2007/0218589 | A1* | 9/2007 | Machida | H05K 3/4614 438/455 |
| 2011/0233783 | A1* | 9/2011 | Lim | H01L 23/5387 257/762 |
| 2013/0134582 | A1 | 5/2013 | Yu et al. | |
| 2013/0307143 | A1 | 11/2013 | Lin et al. | |
| 2022/0130739 | A1* | 4/2022 | Imafuji | H01L 23/5387 |

FOREIGN PATENT DOCUMENTS

| | | | | | |
|---|---|---|---|---|---|
| CN | 103745959 | A | | 4/2014 | |
| CN | 103730446 | B | * | 8/2016 | |
| CN | 103763848 | B | | 1/2017 | |
| CN | 110010482 | A | * | 7/2019 | H10W 42/20 |
| CN | 110010482 | B | | 10/2020 | |
| CN | 115226366 | A | * | 10/2022 | H05K 7/20145 |
| EP | 2333831 | B1 | * | 3/2016 | H10W 90/00 |
| JP | 2022079292 | A | * | 5/2022 | H10W 90/401 |
| KR | 20050005241 | A | | 1/2005 | |
| WO | WO 2017/087899 | A1 | | 5/2017 | |

* cited by examiner

SEMICONDUCTOR PACKAGE AND SYSTEM INCLUDING SEMICONDUCTOR PACKAGE

CROSS-REFERENCE TO RELATED APPLICATION(S)

This application claims benefit of priority to Korean Patent Application No. 10-2022-0113986, filed on Sep. 8, 2022 in the Korean Intellectual Property Office, the disclosure of which is incorporated herein by reference in its entirety.

BACKGROUND

The present disclosure relates to a semiconductor package and a system including the same.

In accordance with the rapid development of the electronics industry and the needs of users, electronic devices have been reduced in size and weight, and accordingly, a high degree of integration of a semiconductor device, a core component of an electronic device, has been required. In addition, with the development of mobile products, miniaturization and multifunctionality have together been required.

Accordingly, in order to provide a multifunctional semiconductor package, a package-on-package (PoP) type semiconductor package in which a semiconductor package having a different function is stacked on another semiconductor package has been developed.

In the PoP type semiconductor package, it is necessary to form a structure for vertical electrical connection so as to electrically connect upper and lower packages to each other.

SUMMARY

An aspect of the present disclosure provides a semiconductor package capable of simplifying a process.

Another aspect of the present disclosure provides a system including a semiconductor package capable of simplifying a process.

According to an aspect of the present disclosure, there is provided a semiconductor package including a substrate including a first region including a plurality of first redistribution layers, a second region in contact with the first region with to the first and second regions stacked in a first direction, the second region including a plurality of second redistribution layers, and a third region extending from the first and second regions in a second direction, perpendicular to the first direction, to connect the first and second regions to each other in bent form, the third region including a plurality of third redistribution layers, a first semiconductor chip on a first side opposite to a second side of the first region in contact with the second region, a second semiconductor chip on a first side opposite to a second side of the second region in contact with the first region, a first molding member on the first region and covering at least a portion of the first semiconductor chip, and a second molding member on the second region and covering at least a portion of the second semiconductor chip.

According to another aspect of the present disclosure, there is provided a semiconductor package including a substrate including first and second regions and a third region disposed between the first and second regions to connect the first and second regions, the substrate including a plurality of redistribution layers, a first semiconductor chip on a first side of the first region, and a second semiconductor chip on a first side of the second region. The third region of the substrate may be bent such that second sides opposite to the first sides of the first and second regions are in contact with each other.

According to another aspect of the present disclosure, there is provided a system including a printed circuit board, and a semiconductor package bonded to the printed circuit board. The semiconductor package may include a substrate including a first region including a plurality of first redistribution layers, a second region in contact with the first region, the second region including a plurality of second redistribution layers, and a third region extending from each of the first and second regions and including a bend to connect the first and second regions to each other, the third region including a plurality of third redistribution layers, a first semiconductor chip on a first side opposite to a second side of the first region in contact with the second region, a second semiconductor chip disposed on a first side opposite to a second side of the second region in contact with the first region, a first molding member on the first region, the first molding member covering at least a portion of the first semiconductor chip, and a second molding member on the second region, the second molding member covering at least a portion of the second semiconductor chip. A plurality of pads, electrically connected to at least a portion of the plurality of third redistribution layers, may be on a convex outermost surface of the third region at the bend. The semiconductor package may be bonded to the printed circuit board through a plurality of connection members respectively connected to the plurality of pads.

A multichip package type semiconductor package may be implemented using a flexible substrate including a plurality of redistribution layers, such that a structure for vertical electrical connection such as a copper post and a backside redistribution layer may be omitted. Accordingly, a semiconductor package capable of simplifying a process and a system including the same may be provided.

The various and beneficial advantages and effects of the present disclosure are not limited to the above, and will be more easily understood in the course of describing specific example embodiments of the present disclosure.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, example embodiments of the present disclosure will be described with reference to the accompanying drawings.

Figure 1:
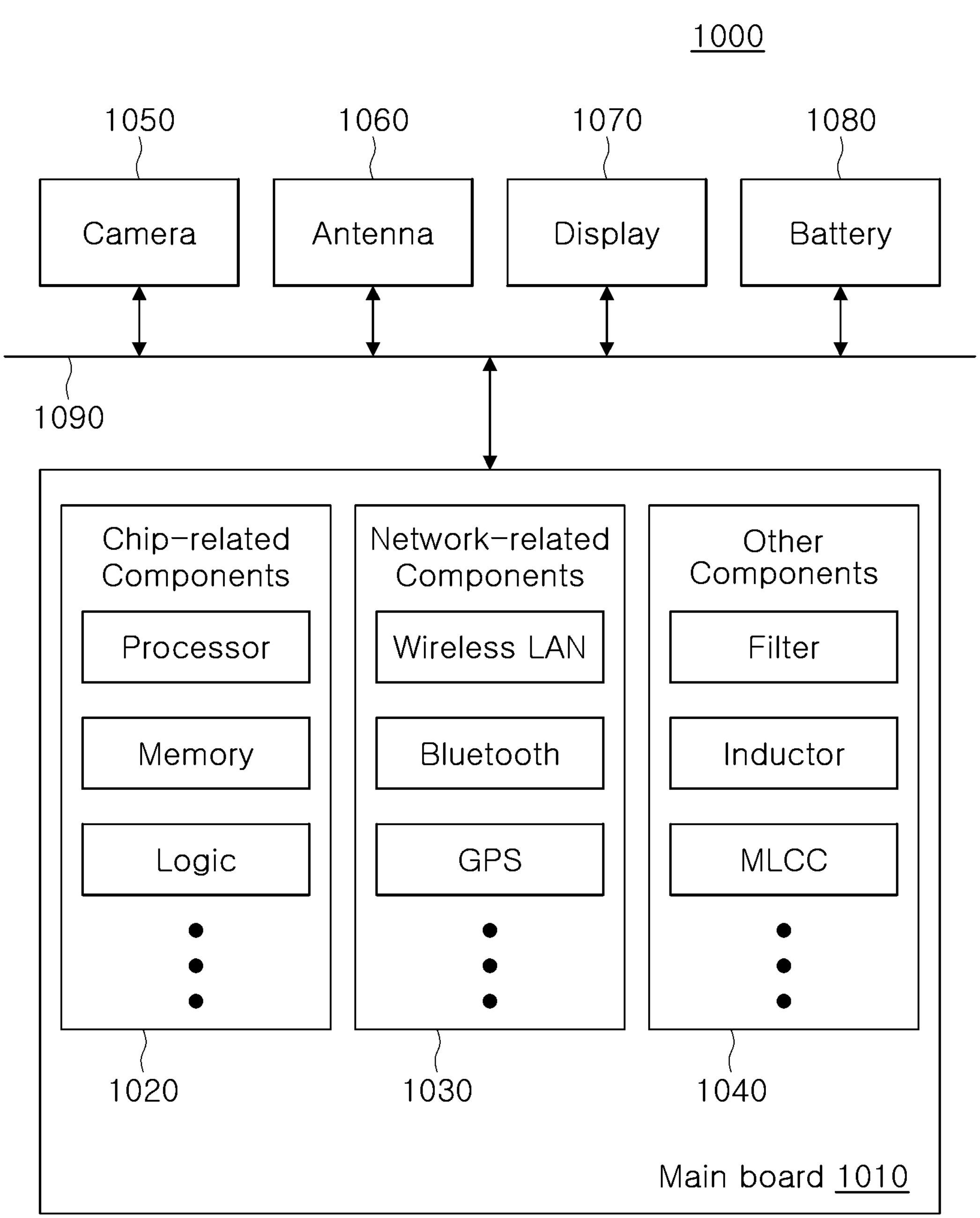
FIG. 1 is a schematic block diagram illustrating an electronic device according to example embodiments.

FIG. 1 is a schematic block diagram illustrating an electronic device according to example embodiments.

Referring to FIG. 1, an electronic device 1000 may accommodate a main board 1010 therein. The main board 1010 may include chip-related components 1020, network-related components 1030, and other components 1040, physically and/or electrically connected thereto. The above-described components may be combined with other electronic components to be described below to form various signal lines 1090.

The chip-related components 1020 may include a memory chip such as a volatile memory (for example, DRAM), a non-volatile memory (for example, ROM), or a flash memory, an application processor chip such as a central processor (for example, CPU), a graphic processor (for example, GPUs), a digital signal processor, an encryption processor, a microprocessor, or a microcontroller, and a logic chip such as an analog-to-digital converter and an application-specific IC (ASIC). However, the chip-related components 1020 are not limited thereto, and may also include other types of chip-related components. In addition, the chip-related components 1020 may also be combined with each other. The chip-related components 1020 may be in the form of a package including the above-described chips or electronic component.

The network-related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the above-described protocols. In addition, the network-related components 1030 may be combined with each other, together with the chip-related components 1020 described above.

The other components 1040 may include a high-frequency inductor, a ferrite inductor, a power inductor, ferrite beads, a low-temperature co-fired ceramic (LTCC), an electromagnetic interference (EMI) filter, a multilayer ceramic capacitor (MLCC), or the like. However, the other components 1040 are not limited thereto, and may also include passive components used for various other purposes, or the like. In addition, the other components 1040 may be combined with each other, together with the chip-related components 1020 or the network-related components 1030 described above.

Depending on a type of the electronic device 1000, the electronic device 1000 may include other components that may or may not be physically or electrically connected to the main board 1010 (e.g., motherboard). The other components may include, for example, a camera module 1050, an antenna 1060, a display 1070, a battery 1080, or the like. However, the other components are not limited thereto, and may also include an audio codec, a video codec, a power amplifier, a compass, an accelerometer, a gyroscope, a speaker, a mass storage unit (for example, a hard disk drive), a compact disk (CD), a digital versatile disk (DVD), or the like. However, the other components are not limited thereto, and may also include other components used for various purposes depending on the type of electronic device 1000.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device processing data.

Figure 2:
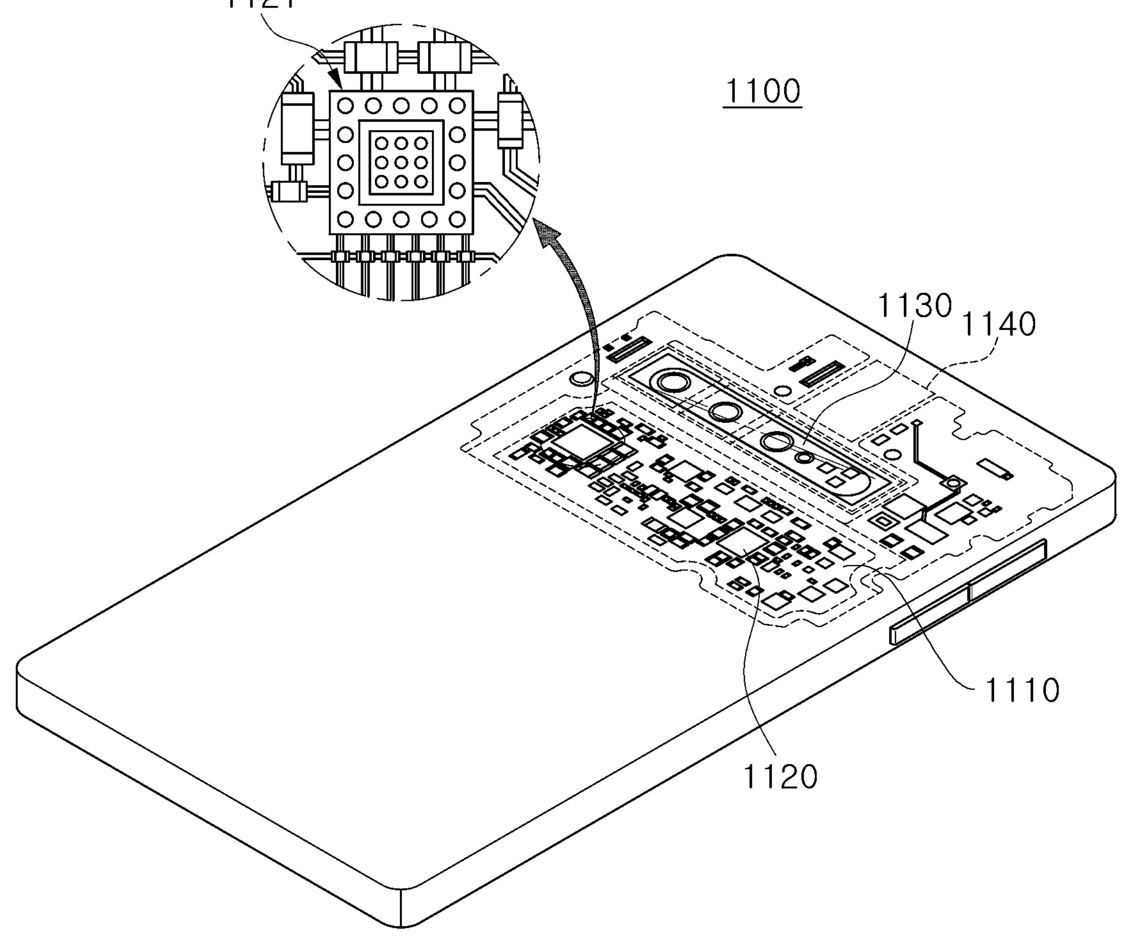
FIG. 2 is a schematic perspective view illustrating an electronic device according to example embodiments.

FIG. 2 is a schematic perspective view illustrating an electronic device according to example embodiments.

Referring to FIG. 2, the electronic device may be, for example, a smartphone 1100. A motherboard 1110 may be accommodated in the smartphone 1100, and various electronic components 1120 may be physically and/or electrically connected to the motherboard 1110. In addition, other components that may or may not be physically and/or electrically connected to the motherboard 1110, such as a camera module 1130 and/or a speaker 1140, may be accommodated therein. Some of the electronic components 1120 may be the above-described chip-related components, for example, a component package 1121, but are not limited thereto. The component package 1121 may be in the form of a printed circuit board on which electronic components including active components and/or passive components are surface-mounted. Alternatively, the component package 1121 may be in the form of a printed circuit board in which active components and/or passive components are embedded. The component package 1121 may be various types of semiconductor packages. The electronic device is not necessarily limited to the smartphone 1100, and may be other electronic devices as described above.

Figure 3:
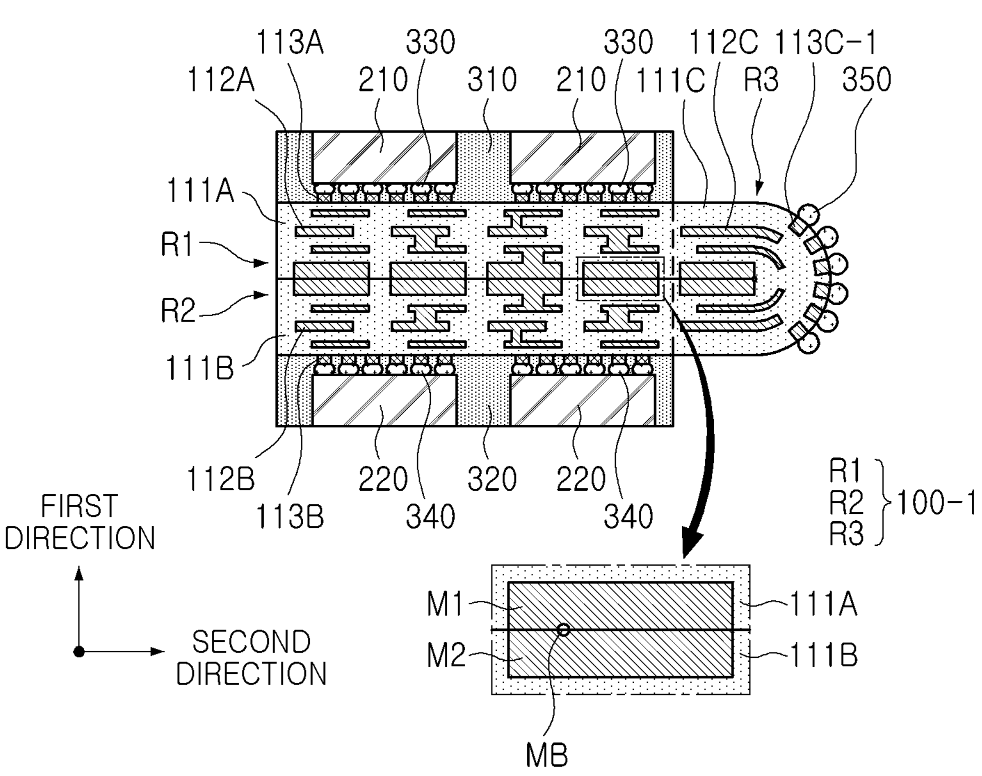
FIG. 3 is a schematic cross-sectional view illustrating a semiconductor package according to example embodiments.

FIG. 3 is a schematic cross-sectional view illustrating a semiconductor package according to example embodiments.

Referring to FIG. 3, a semiconductor package 500-1 may include a substrate 100-1, first and second semiconductor chips 210 and 220 disposed on the substrate 100-1, and first and second molding members 310 and 320 disposed on the substrate 100-1 to respectively cover at least portions of the first and second semiconductor chips 210 and 220.

The substrate 100-1 may have a first region R1 including a plurality of first redistribution layers 112A, a second region R2 disposed to be in contact with the first region R1 with respect to a first direction, the second region R2 including a plurality of second redistribution layers 112B, and a third region R3 extending from the first and second regions R1 and R2 with respect to a second direction, perpendicular to the first direction, to connect the first and second regions R1 and R2 to each other in bent form, the third region R3 including a plurality of third redistribution layers 112C. The first region R1 and second region R2 may be in contact with the first and second regions R1 and R2 stacked in the first direction. The first semiconductor chip 210 may be on a first side of the first region R1 opposite to a second side of the first region R1 in contact with the second region R2. The second semiconductor chip 220 may be a first side of the second region R2 opposite to a second side of the second region R2 in contact with the first region R1.

The first to third regions R1, R2, and R3 may include first to third insulating layers 111A, 111B, and 111C, respectively. The first to third insulating layers 111A, 111B, and 111C may be one insulating layer integrated with each other.

The first to third insulating layers 111A, 111B, and 111C may include a flexible insulating layer. For example, the substrate 100-1 may be a flexible printed circuit board. The flexible insulating layer may be an insulating layer having excellent bendability, and may have, for example, an elastic modulus smaller than that of an insulating layer used for a general rigid substrate. The flexible insulating layer may be capable of bending. The flexible insulating layer may include a photosensitive insulating material. The photosensitive insulating material may include, for example, polyimide (PI), polyparaphenylene benzobisoxazole (PBO), polyhydroxystyrene (PHS), and the like.

Each of the first to third redistribution layers 112A, 112B, and 112C may include a wiring portion and a via portion. The wiring portion and the via portion may include a metal material. The metal material may include copper (Cu), aluminum (Al), silver (Ag), tin (Sn), gold (Au), nickel (Ni), lead (Pb), titanium (Ti), or alloys thereof. The first to third redistribution layers 112A, 112B, and 112C may each include an electroless plating layer (or chemical copper) and an electrolytic plating layer (or electrolytic copper), but the first to third redistribution layers 112A, 112B, and 112C are not limited thereto. Instead of chemical copper, a sputter layer may be formed as the electroless plating layer. If necessary, copper foil may be further included. Each of the first to third redistribution layers 112A, 112B, and 112C may perform various functions depending on a design of a corresponding layer. For example, a ground pattern, a power pattern, a signal pattern, a ground via, a power via, a signal via, and the like may be included. Each of the patterns may include a trace pattern, a plane pattern, and/or a pad pattern.

At least a portion M1 of the first redistribution layer 112A disposed to be most adjacent to the second region R2 with respect to the first direction, among the plurality of first redistribution layers 112A, and at least a portion M2 of the second redistribution layer 112B disposed to be most adjacent to the first region R1 with respect to the first direction, among the plurality of second redistribution layers 112B, may be in contact with each other. As a result, an intermetallic bond (MB) may be formed, through which the plurality of first redistribution layers 112A and the plurality of second redistribution layers 112B may be electrically connected to each other with respect to the first direction. For example, a vertical electrical connection path may be provided without a copper post or the like.

For easier bonding, each of wiring portions of the first and second redistribution layers 112A and 112B in contact with each other may be thicker than each of the other wiring portions of the first and second redistribution layers 112A and 112B.

At least a portion of the plurality of third redistribution layers 112C may be electrically connected to at least portions of the plurality of first and second redistribution layers 112A and 112B with respect to the second direction. At least a portion of the plurality of third redistribution layers 112C may be bent together when the third region R3 is bent. For example, at least a portion of the plurality of third redistribution layers 112C and the third region R3 may be bent in the same direction.

The first and second semiconductor chips 210 and 220 may include an integrated circuit die in which hundreds to millions of devices or more are integrated into one chip. Here, the integrated circuit may be, for example, a memory chip such as a graphics card memory such as a graphics double date rate (GDDR). However, the integrated circuit is not limited thereto, and may be a central processor (for example, CPU), a graphic processor (for example, GPU), a field programmable gate array (FPGA), an application processor (for example, AP), a volatile memory (for example, DRAM), a non-volatile memory (for example, ROM), a power management IC (PMIC), and the like.

The first and second semiconductor chips 210 and 220 may be formed based on an active wafer. In this case, silicon (Si), germanium (Ge), gallium arsenide (GaAs), or the like may be used as a base material included in each body. Various circuits may be formed in the body. A connection pad may be formed in each body, and the connection pad may include a conductive material such as aluminum (Al), copper (Cu), or the like.

A plurality of first and second semiconductor chips 210 and 220 may be disposed, and the plurality of first and second semiconductor chips 210 and 220 may be of the same or different types. The first and second semiconductor chips 210 and 220 may be electrically connected to each other in the first direction through the plurality of first and second redistribution layers 112A and 112B.

The first and second molding members 310 and 320 may protect the first and second semiconductor chips 210 and 220. The first and second molding members 310 and 320 may include a well-known molding material such as an epoxy molding compound (EMC).

Back surfaces, for example, inactive surfaces, of the first and second semiconductor chips 210 and 220 may be exposed from the first and second molding members 310 and 320, respectively, thereby further reducing a thickness of the semiconductor package 500-1, and facilitating heat dissipation.

A plurality of first and second pads 113A and 113B, electrically connected to at least portions of the plurality of first and second redistribution layers 112A and 112B, may be disposed on outermost sides of the first and second regions R1 and R2, respectively. The plurality of first and second pads 113A and 113B may have a form of a bump protruding from the substrate 100-1. The plurality of first and second pads 113A and 113B may include a metal material. The metal material may include copper (Cu), aluminum (Al), silver (Ag), tin (Sn), gold (Au), nickel (Ni), lead (Pb), titanium (Ti), or alloys thereof. The plurality of first and second pads 113A and 113B may include a ground pad, a power pad, a signal pad, and the like.

The first and second semiconductor chips 210 and 220 may be connected to the plurality of first and second pads 113A and 113B through the plurality of first and second connection members 330 and 340, respectively. The plurality of first and second connection members 330 and 340 may each include a low melting metal having a melting point lower than that of copper (Cu), for example, tin (Sn) or an alloy containing tin (Sn). For example, the plurality of first and second connection members 330 and 340 may each include a solder bump.

A plurality of third pads 113C-1, electrically connected to the plurality of third redistribution layers 112C, may be disposed on an outermost side of the third region R3. The third region R3 may include a bend (e.g., a bend of 180 degrees or about 180 degrees) to connect the first and second regions R1 and R2 to each other. The plurality of third pads 113C-1 may be on a convex outermost surface of the third region R3 at the bend. The plurality of third pads 113C-1 may have a form of a pad buried in the substrate 100-1. The plurality of third pads 113C-1 may include a metal material. The metal material may include copper (Cu), aluminum (Al), silver (Ag), tin (Sn), gold (Au), nickel (Ni), lead (Pb), titanium (Ti), or alloys thereof. The plurality of third pads 113C-1 may include a ground pad, a power pad, a signal pad, and the like.

A plurality of third connection members 350, respectively connected to the plurality of third pads 113C-1, may be disposed on the plurality of third pads 113C-1. The third connection member 350 may include a low melting metal having a lower melting point than that of copper (Cu), for example, tin (Sn) or an alloy containing tin (Sn). For example, the third connection member 350 may include a solder, and may have a form such as a land, a ball, a pin, or the like.

Although the semiconductor package 500-1 is of a multichip package type, a process of forming a copper post or a process of forming a backside redistribution layer may be omitted, thereby simplifying a process. In addition, various issues that may occur in the process of forming a copper post or the process of forming a backside redistribution layer may be prevented. In addition, a structure of the semiconductor package 500-1 may facilitate heat dissipation, thereby improving an operation function of the semiconductor chip and extending a lifespan thereof.

FIGS. 4 to 12 are cross-sectional views illustrating a method of manufacturing a semiconductor package according to example embodiments in a stepwise manner.

Figure 4:
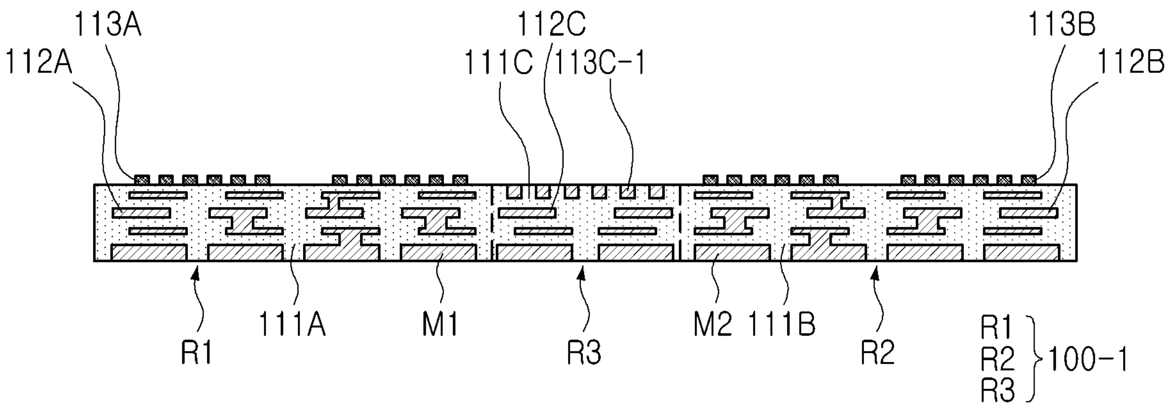
FIGS. 4 to 12 are cross-sectional views illustrating a method of manufacturing a semiconductor package according to example embodiments in a stepwise manner.

Referring to FIG. 4, the substrate 100-1 having the first and second regions R1 and R2 and the third region R3 disposed between the first and second regions R1 and R2 to connect the first and second regions R1 and R2 to each other, the substrate 100-1 including the plurality of first to third redistribution layers 112A, 112B, and 112C may be prepared. The substrate 100-1 may be a flexible substrate including the flexible insulating layers 111A, 111B, and 111C. The first to third pads 113A, 113B, and 113C-1 may be formed on outermost sides of the first to third regions R1, R2, and R3 of the substrate 100-1, respectively. The plurality of first to third redistribution layers 112A, 112B, and 112C and the plurality of first to third pads 113A, 113B, and 113C-1 may be formed through an additive process (AP), a semi additive process (SAP), a modified semi additive process (MSAP), tenting (TT), or the like, respectively.

Figure 5:
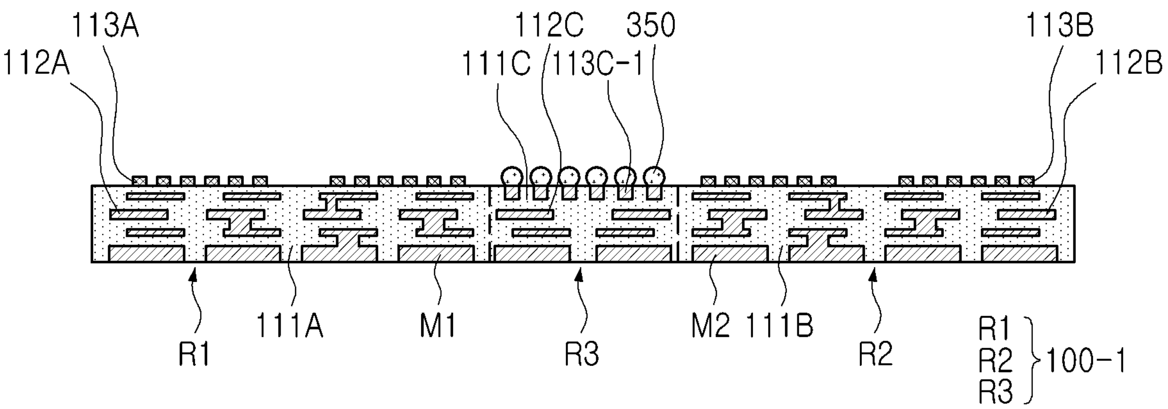

Referring to FIG. 5, the plurality of third connection members 350 may be formed on the plurality of third pads 113C-1 of the third region R3 of the substrate 100-1, respectively. The plurality of third connection members 350 may be formed by respectively attaching a plurality of solder balls to the plurality of third pads 113C-1, and then performing a reflow process, but the present disclosure is not limited thereto.

Figure 6:
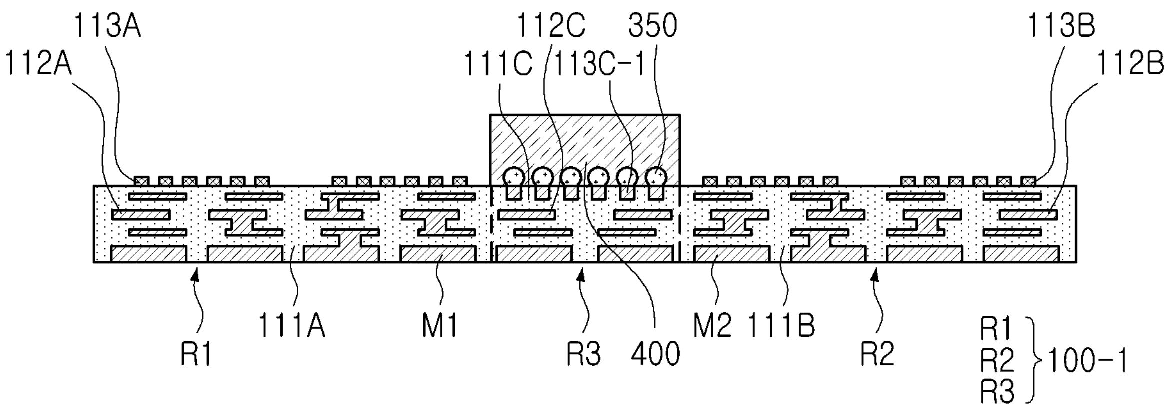

Referring to FIG. 6, a block member 400 covering the plurality of third connection members 350 may be formed on the third region R3 of the substrate 100-1. The block member 400 may protect the third connection member 350 in a subsequent process. The block member 400 may be formed by attaching a photoresist film and then patterning or attaching a protective film.

Figure 7:
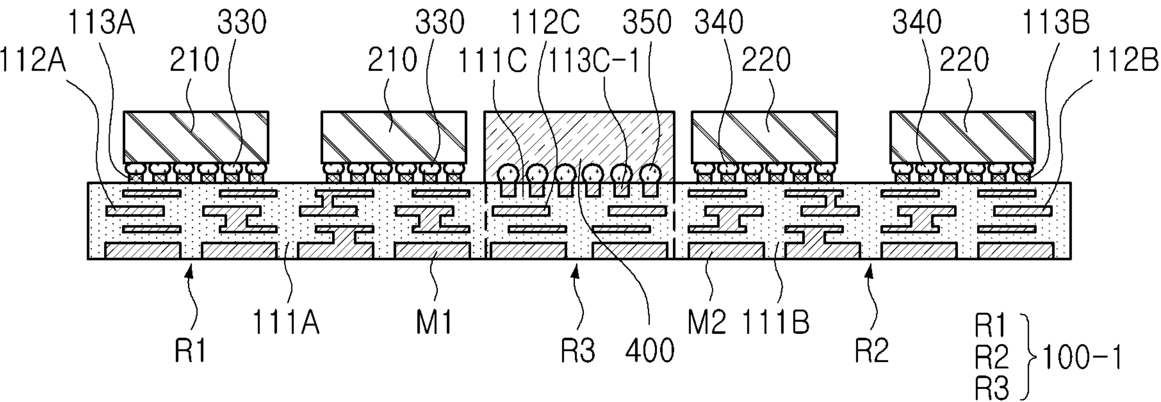

Referring to FIG. 7, the first and second semiconductor chips 210 and 220 may be disposed on the first and second regions R1 and R2 of the substrate 100-1, respectively. The first and second semiconductor chips 210 and 220 may be respectively connected to the plurality of first and second pads 113A and 113B through the plurality of first and second connection members 330 and 340 each including a solder bump, and may be mounted on the substrate 100-1.

Figure 8:
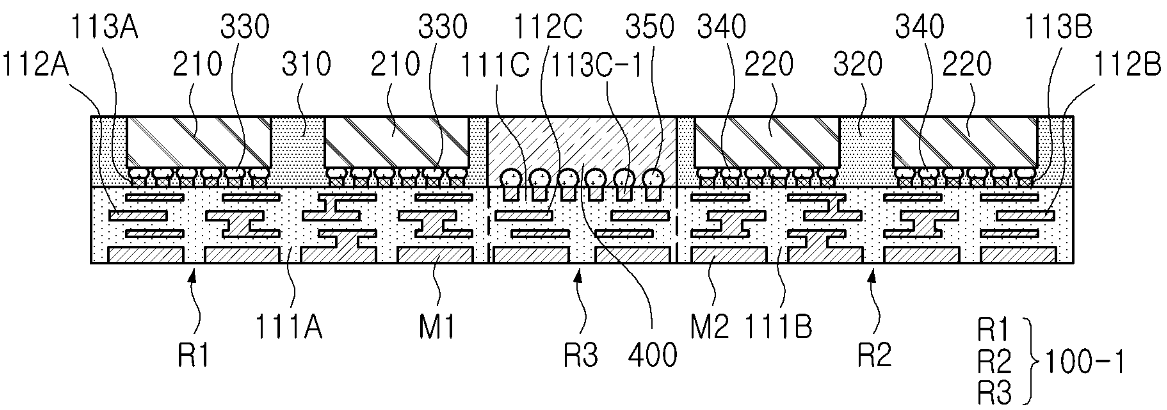

Referring to FIG. 8, first and second molding members 310 covering the first and second semiconductor chips 210 and 220 may be formed on the first and second regions R1 and R2 of the substrate 100-1. The first and second molding members 310 and 320 may be formed to cover back surfaces of the first and second semiconductor chips 210 and 220, and then the back surfaces of the first and second semiconductor chips 210 and 220 may be processed through a polishing process such that the back surfaces of the first and second semiconductor chips 210 and 220 are exposed.

Figure 9:
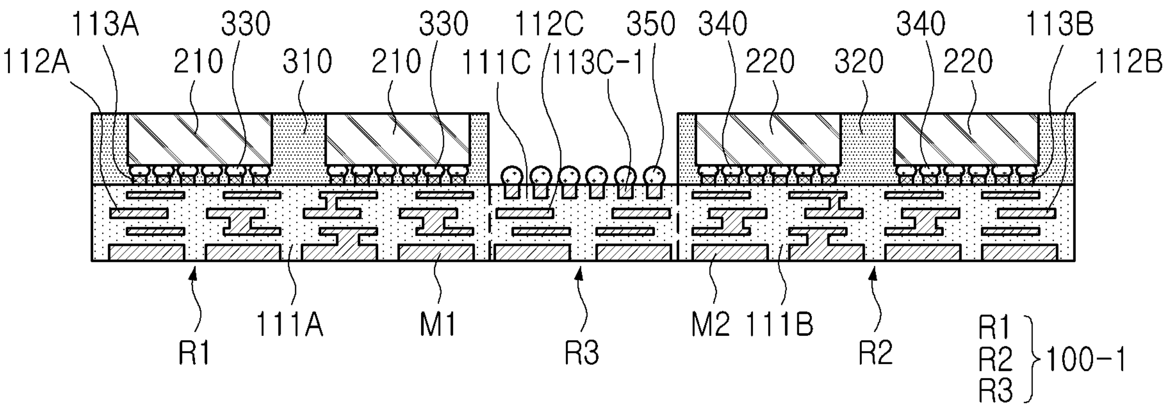

Referring to FIG. 9, the block member 400 may be removed. In addition, the substrate 100-1 having a panel size may be cut per unit. For example, a singulation process may be performed.

Figure 10:
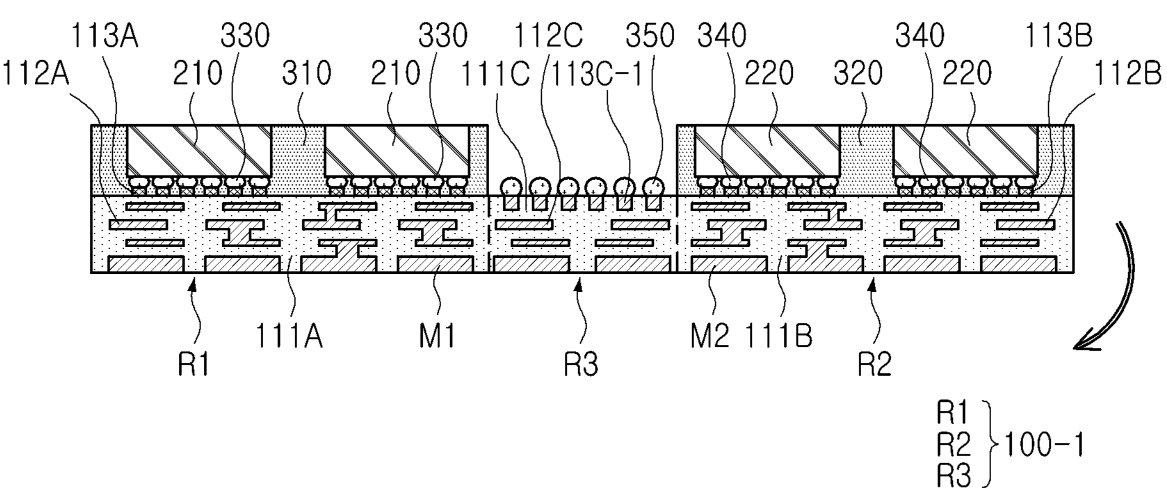
Figure 11:
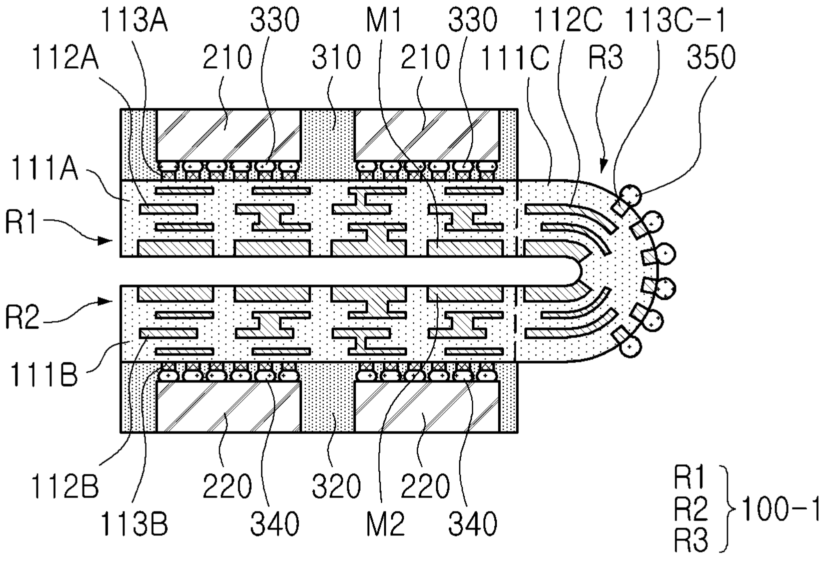

Referring to FIGS. 10 and 11, the substrate 100-1 may be bent. For example, the third region R3 may be bent such that sides opposite to sides of the first and second regions R1 and R2 on which the first and second semiconductor chips 210 and 220 are respectively disposed are in contact with each other.

Figure 12:
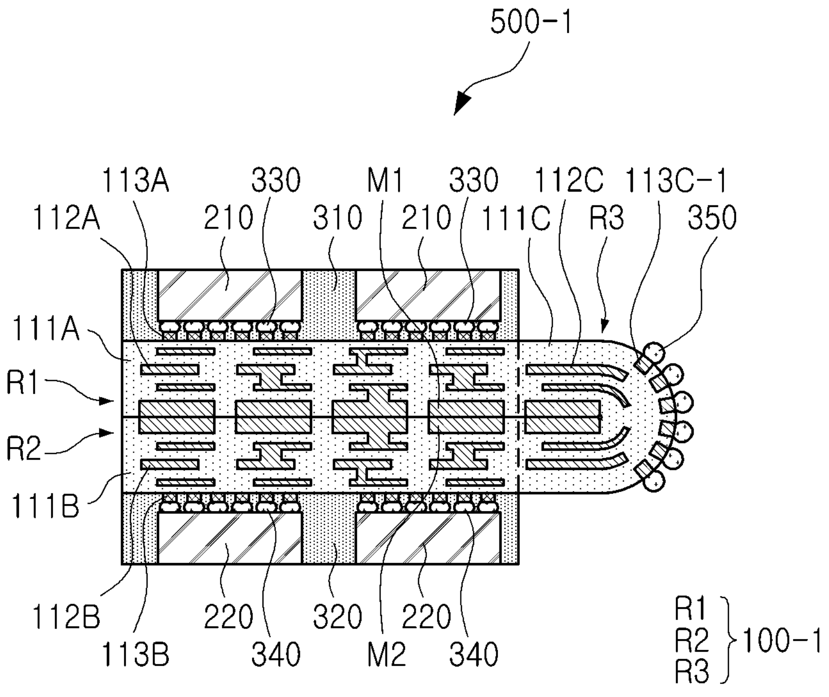

Referring to FIG. 12, sides opposite to sides of the first and second regions R1 and R2 on which the first and second semiconductor chips 210 and 220 are respectively disposed may be bonded to each other. For example, first, the first and second insulating layers 111A and 111B may be bonded to each other through heat treatment, and then heat treatment may be performed at higher temperature to bond, to each other, at least portions M1 and M2 of the first and second redistribution layers 112A and 112B disposed to be adjacent to each other. The above-described semiconductor package 500-1 may be manufactured through a series of processes.

A description of configurations other than the above-described configuration may overlap the description provided above in connection with the semiconductor package 500-1, and may thus be omitted in the interest of brevity.

Figure 13:
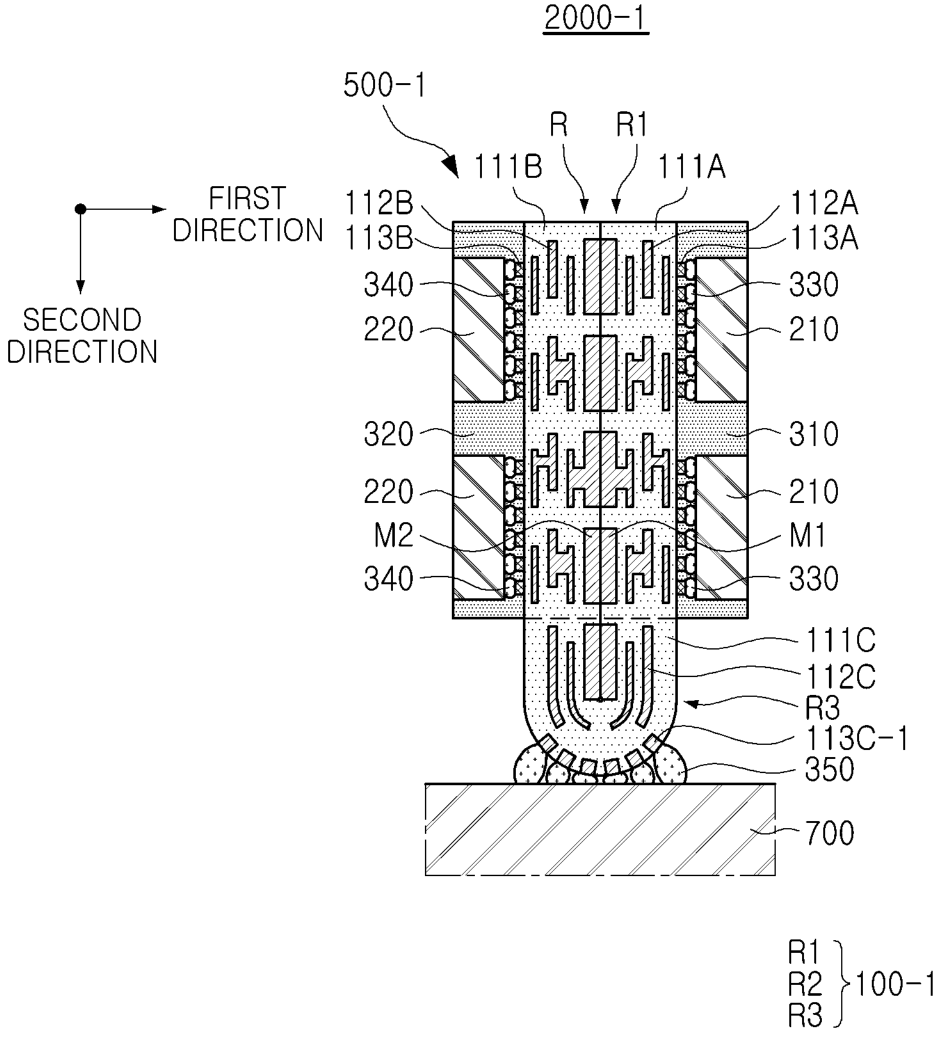
FIG. 13 is a schematic cross-sectional view illustrating a system according to example embodiments.

FIG. 13 is a schematic cross-sectional view illustrating a system according to example embodiments.

Referring to FIG. 13, a system 2000-1 may include a printed circuit board 700 and the semiconductor package 500-1 bonded to the printed circuit board 700.

The printed circuit board 700 may be a main board. However, the printed circuit board 700 is not limited thereto, and may be a package board.

The semiconductor package 500-1 may be bonded to the printed circuit board 700 through the plurality of third connection members 350 connected to the plurality of third pads 113C-1 disposed in the third region R3 of the substrate 100-1. The semiconductor package 500-1 may be bonded in a second direction. After bonding, the plurality of third connection members 350 may have different heights.

A description of configurations other than the above-described configuration may overlap the description provided above in connection with the semiconductor package 500-1, and may thus be omitted in the interest of brevity.

Figure 14:
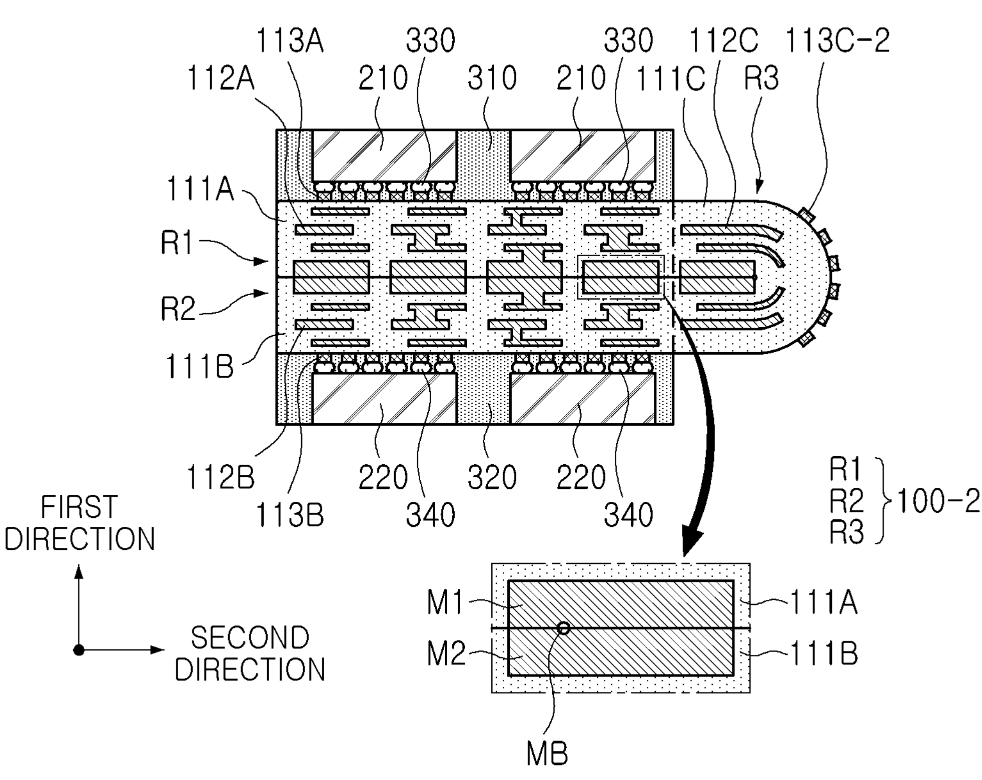
FIG. 14 is a schematic cross-sectional view illustrating a semiconductor package according to example embodiments.

FIG. 14 is a schematic cross-sectional view illustrating a semiconductor package according to example embodiments.

Referring to FIG. 14, a semiconductor package 500-2 may include a substrate 100-2, first and second semiconductor chips 210 and 220 disposed on the substrate 100-2, and first and second molding members 310 and 320 disposed on the substrate 100-2, the first and second molding members 310 and 320 respectively covering at least portions of the first and second semiconductor chips 210 and 220.

A plurality of third pads 113C-2, electrically connected to the plurality of third redistribution layers 112C, may be disposed on an outermost side of the third region R3. In a similar manner to the plurality of first and second pads 113A and 113B, the plurality of third pads 113C-2 may have a form of a bump protruding from the substrate 100-1. The plurality of third pads 113C-2 may include a metal material.

The metal material may include copper (Cu), aluminum (Al), silver (Ag), tin (Sn), gold (Au), nickel (Ni), lead (Pb), titanium (Ti), or alloys thereof. The plurality of third pads 113C-2 may include a ground pad, a power pad, and a signal pad, and the like.

A description of configurations other than the above-described configuration may overlap the description provided above in connection with the semiconductor package 500-1, and may thus be omitted in the interest of brevity.

FIGS. 15 to 22 are cross-sectional views illustrating a method of manufacturing a semiconductor package according to example embodiments in a stepwise manner.

Figure 15:
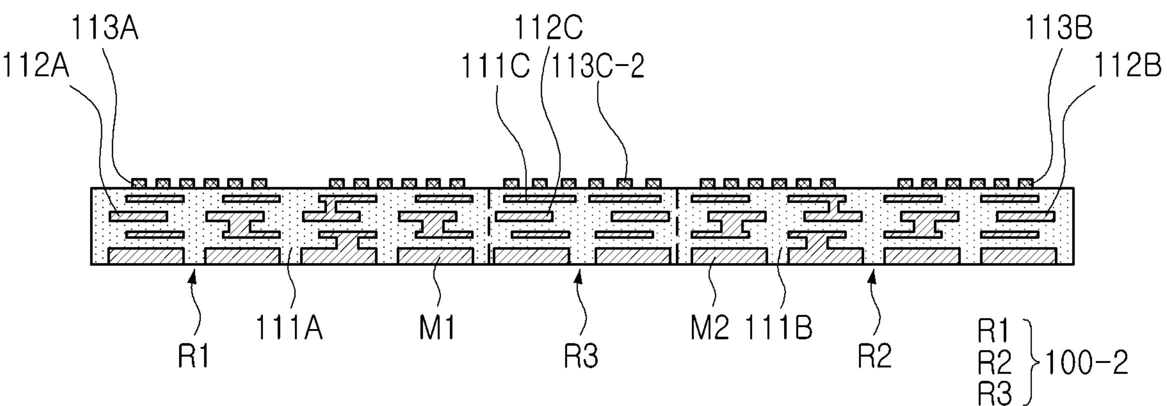
FIGS. 15 to 22 are cross-sectional views illustrating a method of manufacturing a semiconductor package according to example embodiments in a stepwise manner.

Referring to FIG. 15, a substrate 100-2 having the first and second regions R1 and R2 and the third region R3 disposed between the first and second regions R1 and R2 to connect the first and second regions R1 and R2 to each other, the substrate 100-2 including the plurality of first to third redistribution layers 112A, 112B, and 112C may be prepared. The substrate 100-2 may be a flexible substrate including the flexible insulating layers 111A, 111B, and 111C. The first to third pads 113A, 113B, and 113C-2 may be formed on outermost sides of the first to third regions R1, R2, and R3 of the substrate 100-2, respectively.

Figure 16:
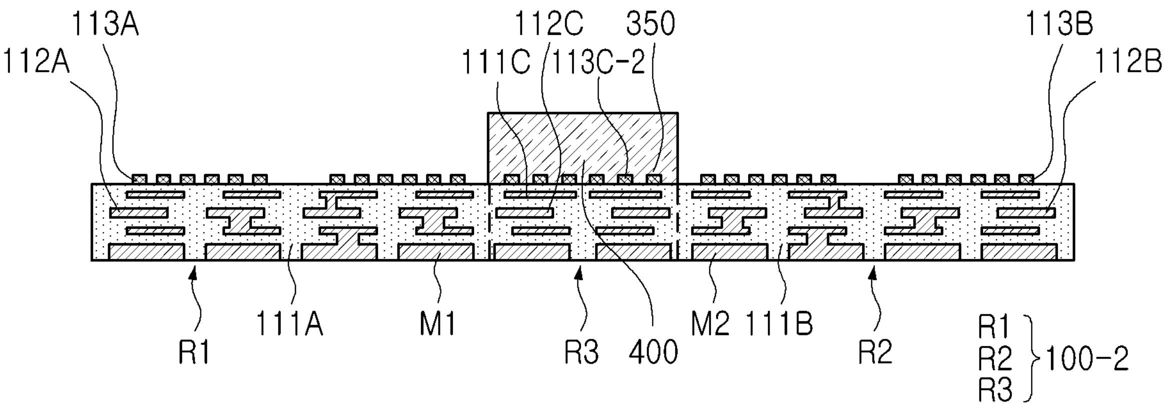

Referring to FIG. 16, the block member 400 covering the plurality of third pads 113C-2 may be formed on the third region R3 of the substrate 100-2. The block member 400 may protect the third pads 113C-2 in a subsequent process. A plurality of third connection members 350, connected to the plurality of third pads 113C-2, may be additionally formed in a bonding process with the printed circuit board 700.

Figure 17:
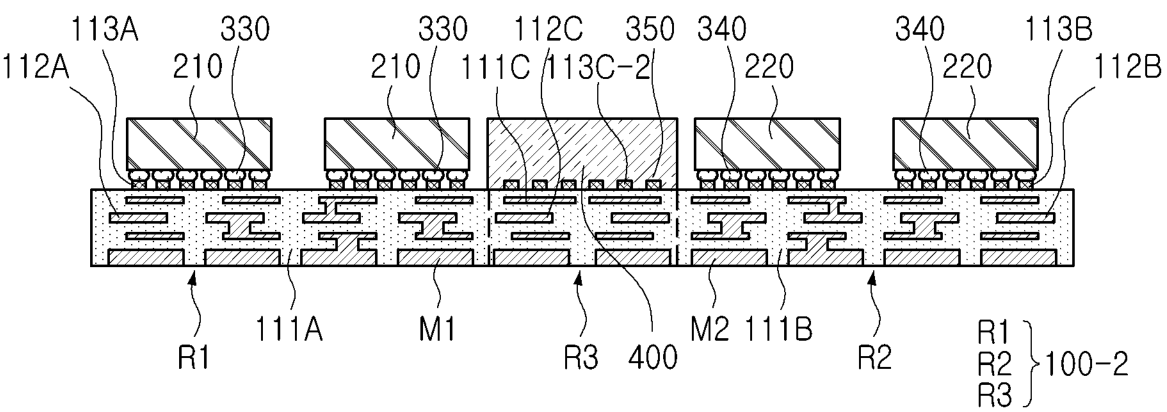

Referring to FIG. 17, the first and second semiconductor chips 210 and 220 may be respectively disposed on the first and second regions R1 and R2 of the substrate 100-2. The first and second semiconductor chips 210 and 220 may be respectively connected to the plurality of first and second pads 113A and 113B through the plurality of first and second connection members 330 and 340 each including a solder bump or the like to be mounted on the substrate 100-2.

Figure 18:
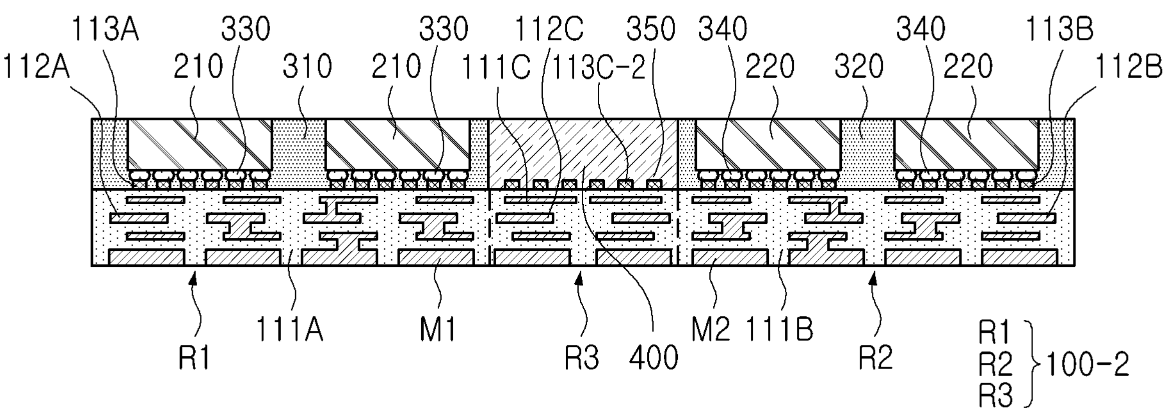

Referring to FIG. 18, first and second molding members 310 and 320 covering the first and second semiconductor chips 210 and 220 may be formed on the first and second regions R1 and R2 of the substrate 100-2. The first and second molding members 310 and 320 may be formed to cover back surfaces of the first and second semiconductor chips 210 and 220, and then the back surfaces of the first and second semiconductor chips 210 and 220 may be processed through a polishing process such that the back surfaces of the first and second semiconductor chips 210 and 220 are exposed.

Figure 19:
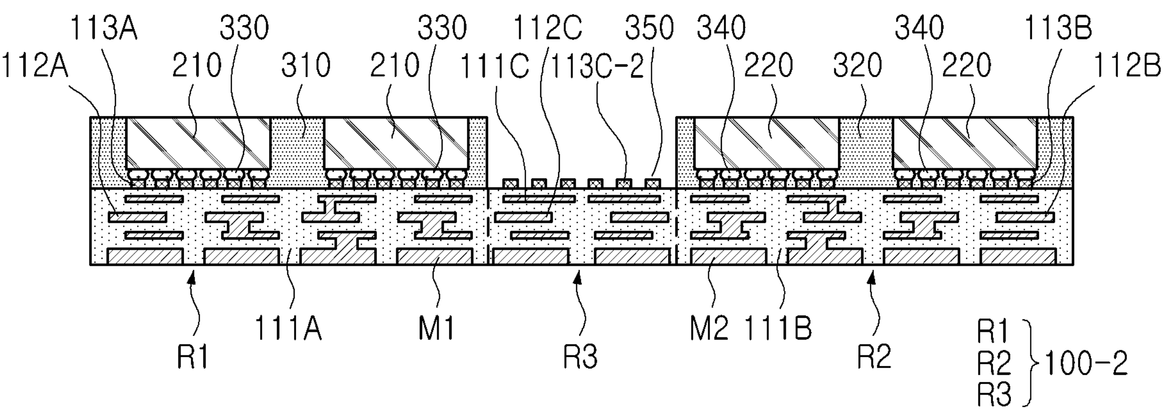

Referring to FIG. 19, the block member 400 may be removed. In addition, the substrate 100-2 having a panel size may be cut per unit. For example, a singulation process may be performed.

Figure 20:
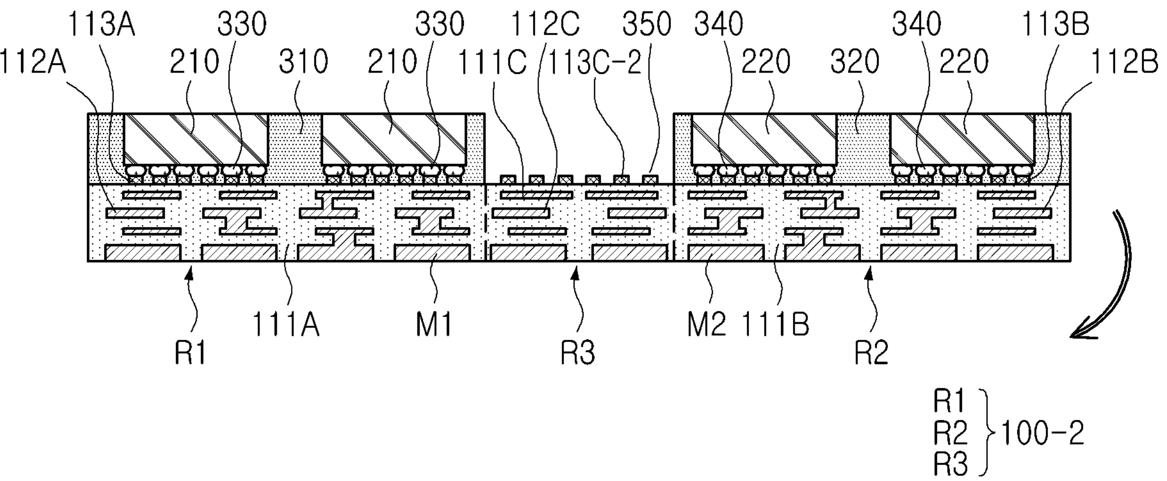
Figure 21:
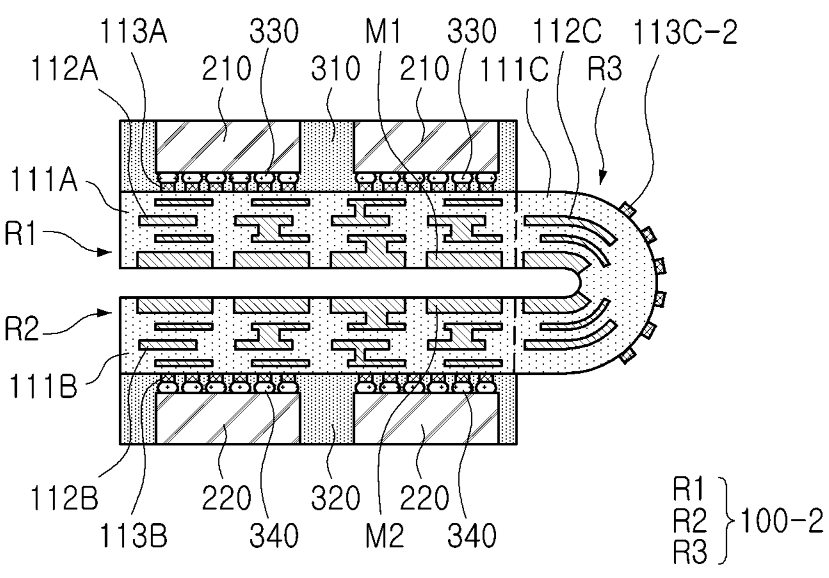

Referring to FIGS. 20 and 21, the substrate 100-2 may be bent. For example, the third region R3 may be bent such that sides opposite to sides of the first and second regions R1 and R2 on which the first and second semiconductor chips 210 and 220 are respectively disposed are in contact with each other.

Figure 22:
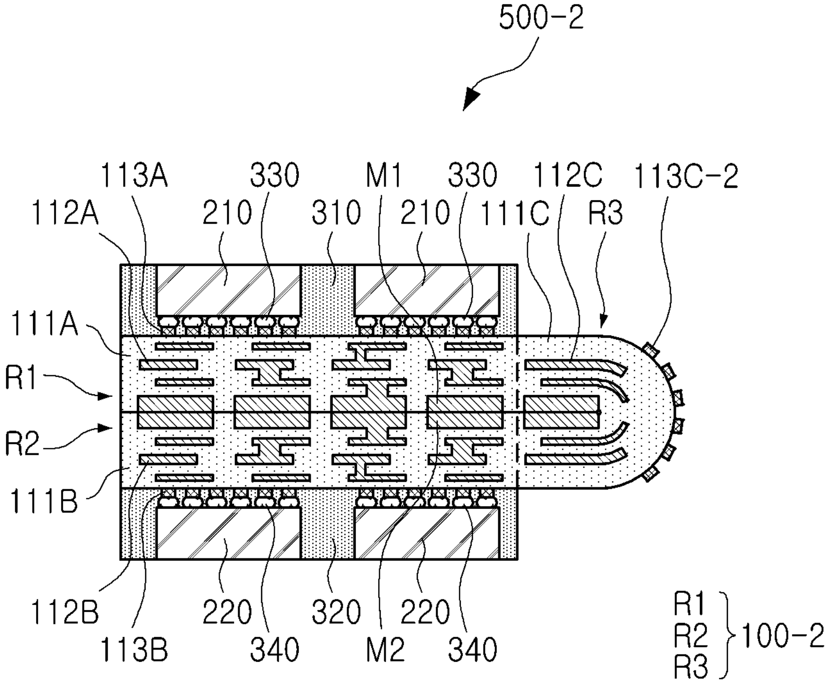

Referring to FIG. 22, sides opposite to sides of the first and second regions R1 and R2 on which the first and second semiconductor chips 210 and 220 are respectively disposed may be bonded to each other. First, the first and second insulating layers 111A and 111B may be bonded to each other through heat treatment, and then heat treatment may be performed at higher temperature to bond, to each other, at least portions M1 and M2 of the first and second redistribution layers 112A and 112B disposed to be adjacent to each other. The above-described semiconductor package 500-2 may be manufactured through a series of processes.

A description of configurations other than the above-described configuration may overlap the description provided above in connection with a method of manufacturing the semiconductor packages 500-1 and 500-2, and may thus be omitted in the interest of brevity.

Figure 23:
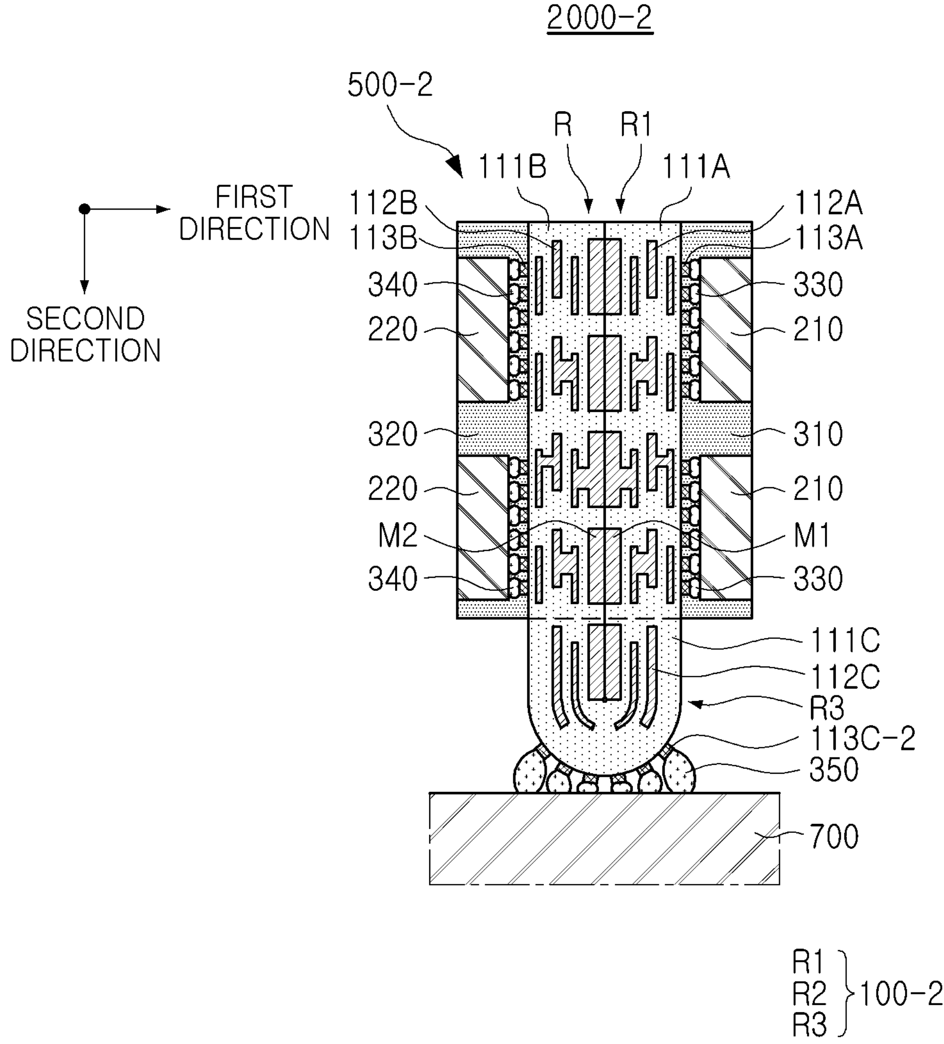
FIG. 23 is a schematic cross-sectional view illustrating a system according to example embodiments.

FIG. 23 is a schematic cross-sectional view illustrating a system according to example embodiments.

Referring to FIG. 23, a system 2000-2 may include a printed circuit board 700 and a semiconductor package 500-2 bonded to the printed circuit board 700.

The semiconductor package 500-2 may be connected to the printed circuit board 700 through the plurality of third connection members 350 connected to the plurality of third pads 113C-2 disposed in the third region R3 of the substrate 100-2. The semiconductor package 500-2 may be bonded in a second direction.

A description of configurations other than the above-described configuration may overlap the description provided above in connection with the semiconductor packages 500-1 and 500-2 and the system 2000-1, and may thus be omitted in the interest of brevity.

While example embodiments have been shown and described above, it will be apparent to those skilled in the art that modifications and variations could be made without departing from the scope of the present disclosure as defined by the appended claims.

What is claimed is:

1. A semiconductor package comprising:

a substrate including a first region including a plurality of first redistribution layers, a second region having a top surface that is in direct contact with a bottom surface of the first region with the first and second regions stacked in a first direction, the second region including a plurality of second redistribution layers, and a third region extending from the first and second regions in a second direction, perpendicular to the first direction, to connect the first and second regions to each other in bent form, the third region including a plurality of third redistribution layers;

a first semiconductor chip on a first side opposite to a second side of the first region in contact with the second region;

a second semiconductor chip on a first side opposite to a second side of the second region in contact with the first region;

a first molding member on the first region and covering at least a portion of the first semiconductor chip; and a second molding member on the second region and covering at least a portion of the second semiconductor chip.

2. The semiconductor package of claim 1, wherein at least a portion of a first redistribution layer most adjacent the second region, among the plurality of first redistribution layers, and at least a portion of a second redistribution layer most adjacent the first region, among the plurality of second redistribution layers, are in contact with each other.

3. The semiconductor package of claim 2, wherein wiring portions of the first and second redistribution layers in contact with each other are thicker than other wiring portions of the first and second redistribution layers.

4. The semiconductor package of claim 1, wherein the first and second semiconductor chips are electrically connected to each other in the first direction through the plurality of first and second redistribution layers.

5. The semiconductor package of claim 1, wherein the first to third regions include a flexible insulating layer.

6. The semiconductor package of claim 5, wherein the flexible insulating layer includes a photosensitive insulating material.

7. The semiconductor package of claim 1, wherein a plurality of first pads, electrically connected to at least a portion of the plurality of first redistribution layers, are on the first side of the first region, a plurality of second pads, electrically connected to at least a portion of the plurality of second redistribution layers, are on the first side of the second region, the first semiconductor chip is connected to the plurality of first pads through a plurality of first connection members, and the second semiconductor chip is connected to the plurality of second pads through a plurality of second connection members.

8. The semiconductor package of claim 7, wherein each of the plurality of first and second connection members includes a solder bump.

9. The semiconductor package of claim 1, wherein a plurality of third pads, electrically connected to at least a portion of the plurality of third redistribution layers, are on an outermost side of the third region.

10. The semiconductor package of claim 9, wherein a plurality of third connection members, respectively connected to the plurality of third pads, are on the plurality of third pads.

11. The semiconductor package of claim 10, wherein each of the plurality of third connection members includes a solder ball.

12. The semiconductor package of claim 1, wherein back surfaces of the first and second semiconductor chips are exposed from the first and second molding members, respectively.

13. The semiconductor package of claim 1, wherein the substrate is a flexible printed circuit board.

14. A semiconductor package comprising:

a substrate including first and second regions and a third region disposed between the first and second regions to connect the first and second regions, a bottom surface of the first region being in direct contact with a top surface of the second region and the substrate including a plurality of redistribution layers;

a first semiconductor chip on a first side of the first region; and a second semiconductor chip on a first side of the second region, wherein the third region of the substrate is bent such that second sides opposite to the first sides of the first and second regions are in contact with each other.

15. The semiconductor package of claim 14, wherein at least portions of two different redistribution layers, among the plurality of redistribution layers, are in contact with each other at an area at which the first and second regions are in contact with each other.

16. The semiconductor package of claim 14, further comprising:

first and second molding members respectively on the first and second regions, the first and second molding members respectively covering at least portions of the first and second semiconductor chips.

17. The semiconductor package of claim 14, wherein a plurality of pads, electrically connected to at least a portion of the plurality of redistribution layers, are on an outermost side of the third region.

18. The semiconductor package of claim 17, wherein a plurality of connection members, respectively connected to the plurality of pads, are on the plurality of pads.

19. A system comprising:

a printed circuit board; and a semiconductor package bonded to the printed circuit board, wherein the semiconductor package includes:

a substrate including a first region including a plurality of first redistribution layers, a second region in contact with the first region, the second region including a plurality of second redistribution layers, and a third region extending from each of the first and second regions and including a bend to connect the first and second regions to each other, the third region including a plurality of third redistribution layers;

a first semiconductor chip on a first side opposite to a second side of the first region in contact with the second region;

a second semiconductor chip disposed on first a side opposite to a second side of the second region in contact with the first region;

a first molding member on the first region, the first molding member covering at least a portion of the first semiconductor chip; and a second molding member on the second region, the second molding member covering at least a portion of the second semiconductor chip, wherein a plurality of pads, electrically connected to at least a portion of the plurality of third redistribution layers, are on a convex outermost surface of the third region at the bend, and the semiconductor package is bonded to the printed circuit board through a plurality of connection members respectively connected to the plurality of pads.

20. The system of claim 19, wherein the semiconductor package is bonded to the printed circuit board with the convex outermost surface of the third region facing the printed circuit board.

* * * * *